United States Patent

Kalberman

[15] 3,641,648

[45] Feb. 15, 1972

[54] PIECE PART HANDLING APPARATUS

[72] Inventor: Louis Werner Kalberman, Allentown, Pa.

[73] Assignee: Bell Telephone Laboratories, Incorporated, Murray Hill, Berkeley Heights, N.J.

[22] Filed: Aug. 20, 1970

[21] Appl. No.: 65,580

[52] U.S. Cl. ............................29/203 B, 29/203 P, 29/203 V

[51] Int. Cl. ..........................................................H05k 13/04

[58] Field of Search ..............29/203 B, 203 P, 203 R, 203 V; 228/49

[56] References Cited

UNITED STATES PATENTS

| | | | |
|---|---|---|---|
| 3,165,818 | 1/1965 | Soffa et al. | 29/203 V |
| 3,391,451 | 7/1968 | Moore | 29/577 |
| 3,452,917 | 7/1969 | Schneider | 228/49 |
| 3,515,877 | 6/1970 | Baxter et al. | 250/202 |

*Primary Examiner*—Thomas H. Eager
*Attorney*—R. J. Guenther and Kenneth B. Hamlin

[57] ABSTRACT

There is described an apparatus for holding an integrated circuit chip and positioning beam leads extending therefrom in registration with conducting pads on a substrate. The apparatus includes a substantially closed cylindrical vacuum chamber having a center axis normal to the surfaces of both the chip and the substrate. The chip is held by vacuum to an opening in one end of the chamber. Both ends of the cylindrical vacuum chamber are transparent so that a line of sight exists along the center axis of the chamber and normal to the surfaces of both the chip and the substrate. This line of sight enables a microscope to bring into focus at once all of the beam leads and the conducting pads associated with the chip.

5 Claims, 2 Drawing Figures

INVENTOR
L. W. KALBERMAN
BY Richard B. Havill
ATTORNEY

PIECE PART HANDLING APPARATUS

BACKGROUND OF THE INVENTION

1. Field of the Invention

The invention is a piece part handling apparatus that is more particularly described as an integrated circuit chip handling and alignment system providing a view of the chip and a substrate on a line of sight normal to their surfaces.

2. Description of the Prior Art

In the prior art, semiconductor chip handling apparatus is well known. Such apparatus is designed to align beam leads of discrete semiconductor circuit chips to associated conducting pads on a substrate. A vacuum pickup needle is arranged to pick up and position the chip so that its beam leads are in registration with the conducting pads on the substrate.

In one example of the prior art, a semiconductor chip handling apparatus includes a microscope having a line of sight inclined to the surfaces of the chip and the substrate because a vacuum pickup needle is located in a line perpendicular to the surfaces of the chip and the substrate. The microscope is used to view the chip and substrate for confirming alignment of the beam leads and the conducting pads. This inclined viewing of the chip and substrate through the microscope produces an image of the pertinent beam lead and substrate area that is partially in focus and partially out of focus. Integrated circuit chips cannot be satisfactorily aligned with conducting pads on a substrate by means of this inclined microscope because integrated circuit chips have many more beam leads with much closer spacing than the beam leads of discrete semiconductor circuits. Because of the close spacing between beam leads of integrated circuits, it is very difficult to confirm the alignment of the beam leads with the conducting pads on the substrate when part of the pertinent area is out of focus.

In another example of the prior art, an optical system is positioned to view through a transparent substrate to a semiconductor chip. The line of sight is normal to the surfaces of both the substrate and the chip so that alignment can be readily checked.

Aligning the chip to the substrate by viewing through the substrate can be accomplished only when the substrate is transparent, but some integrated circuit chips are bonded to an opaque substrate which blocks the line of sight therethrough to the optical system in the last-mentioned example of the prior art.

In view of the desirability of having a line of sight normal to the surfaces of both the integrated circuit chip and the opaque substrate for bringing all of the pertinent area surrounding the chip into focus at once, there exists a need for a chip-handling apparatus providing such a line of sight.

SUMMARY OF THE INVENTION

It is an object of the invention to provide an improved piece part handling and alignment apparatus for positioning a piece part, or integrated circuit chip, on a foundation part, or substrate.

This and other objects of the invention are realized in an illustrative embodiment of a piece part handling apparatus providing a line of sight normal to the surfaces of both a piece part and an opaque foundation part. The apparatus includes a substantially closed cylindrical chamber having a center axis normal to the surfaces. Means are provided for evacuating the chamber and holding the piece part at an opening in a lower end of the chamber over the foundation part. Both ends of the chamber are transparent so that a line of sight exists through the chamber along its center axis normal to the surfaces of both the piece part and the foundation part.

A feature of the invention is a piece part handling section having a line of sight therethrough normal to the surfaces of the piece part and an opaque foundation part with which the piece part is to be aligned.

Another feature is a substantially closed cylindrical chamber having an opening in one end.

Another feature is a means for evacuating the chamber to hold a piece part at the opening.

A further feature is an apparatus including means for aligning an integrated circuit chip to an opaque substrate and means for bonding beam leads of the chip to conducting pads on the substrate.

BRIEF DESCRIPTION OF THE DRAWINGS

A better understanding of the invention may be derived from the detailed description following if that description is considered with respect to the attached drawings in which.

DETAILED DESCRIPTION

Figure 1:
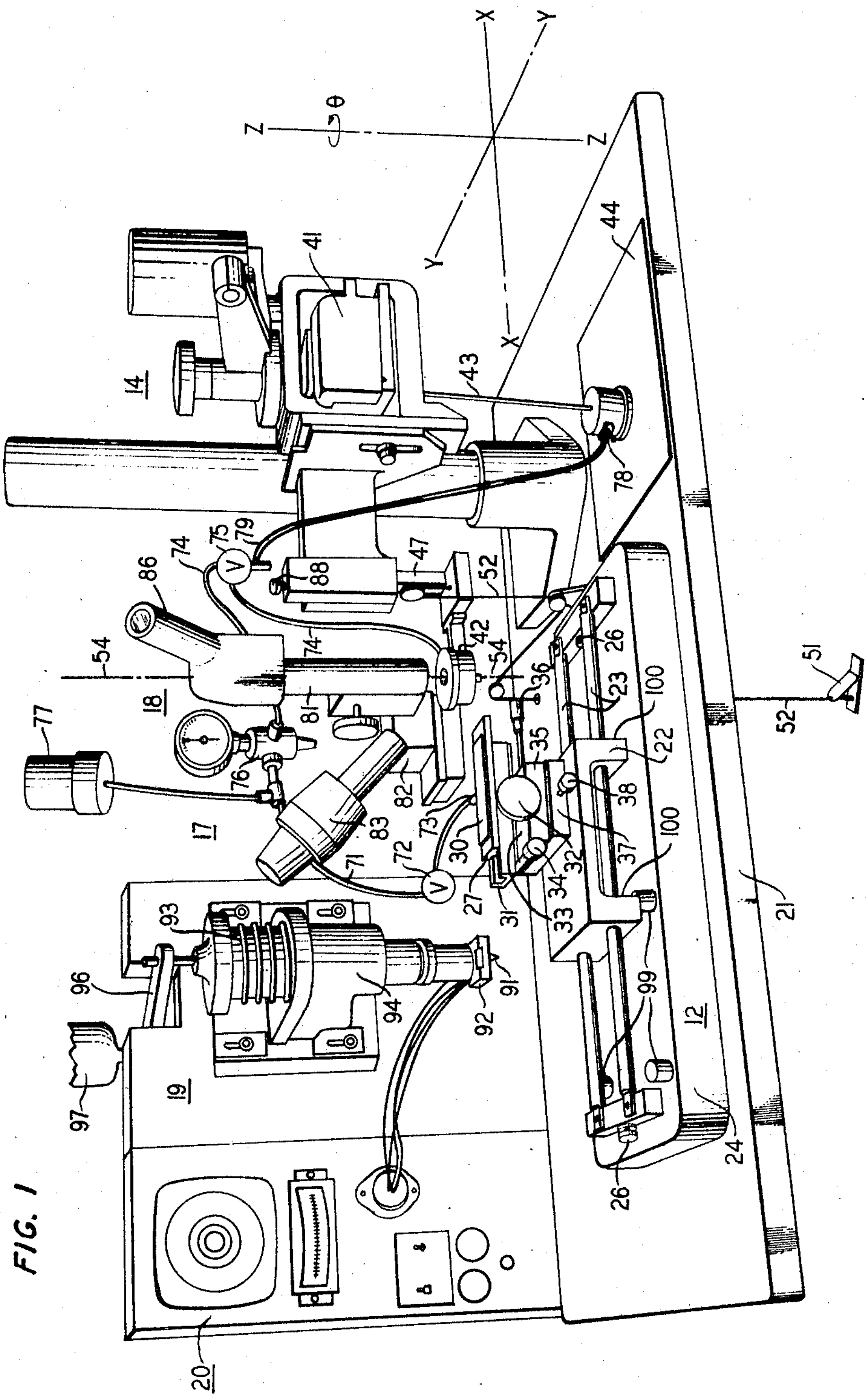
FIG. 1 is a perspective view of a piece part handling and alignment apparatus in accordance with the invention.

Referring now to FIG. 1, there is shown a piece part handling and alignment apparatus for aligning two parts prior to bonding them together. This apparatus includes a foundation part positioning assembly 12, a piece part handling assembly 14, a vacuum system 17, a microscope assembly 18, a bonder assembly 19, and a control console 20, all of which are mounted on top of a workbench 21.

For clarity of the following description, directions of motion are established with reference to a three-dimensional rectangular coordinate system having mutually perpendicular axes X, Y, and Z. The X- and Y-axes lie in a horizontal plane and are positioned so that the X-axis is parallel with the front edge of the workbench 21 and the Y-axis is perpendicular to the front edge of the work bench 21. THe Z-axis is a vertical line.

Any motion that is parallel with any one of the axes will be referred to with reference to that particular axis. That is, a motion parallel with the X-axis will be referred to as an X-motion, and motions parallel to the Y- and Z-axes will be referred to, respectively, as Y- and Z-motions.

In addition, a twist motion about any perpendicular to the top of the workbench 21 will be referred to as a $\theta$-motion. For instance a twisting, or swiveling, motion about the Z-axis is referred to as $\theta$-motion.

The foundation part, or substrate, positioning assembly 12 includes a heavy transversing stage 22 that moves along a pair of guide rails 23 that are permanently attached to a fixed baseplate 24. The traversing stage 22 can be moved to the left or to the right in the X-direction until it strikes either one of two limit, or stop, screws 26. These stop screws 26 fix the maximum distance through which the traversing stage 22 can travel along the X-axis in either direction.

The top of the traversing stage 22 is a horizontal plane to which a foundation part, or substrate, alignment assembly is affixed. This alignment assembly includes four separately adjustable units having a substrate holding platform 27 fixed on top thereof.

A semiconductor substrate, or foundation part, 30 is laid flat on top of the platform 27 so that the upper surface of the substrate is horizontal. The substrate 30 is a substantially pure alumina ceramic having a pattern of plated gold conducting pads affixed on the upper surface thereof. Such alumina ceramic substrate is a substantially opaque material that is fabricated to a width of approximately 1 inch, to a length of approximately 3 inches, and to a thickness of approximately 0.028 inch.

Three pins project upward from the top of the platform 27 to guide the substrate into position on the platform. These three pins project up from the surface of the platform 27 approximately the thickness of the substrate. Two of the pins guide one of the long edges of the substrate in the X-direction, and the third pin guides one of the short edges of the substrate in the Y-direction so that the edges of the substrate lie parallel to the X- and Y-axes.

A rack and pinion assembly housed in a grooved block 31 is arranged to provide gross lateral movement of the substrate platform 27 in the X-direction. An adjustment knob 32 attached to the pinion is turned to achieve whatever gross X-motion of the substrate 30 is desired.

The grooved block 31 is permanently attached to the top of a springnloaded θ-motion assembly 33, which is known in the prior art. There are top and bottom portions of the assembly 33. The θ-motion assembly 33 includes a micrometer screw and thimble 34 for swiveling the top portion and the substrate platform 27 through a very exact angle with respect to the bottom portion and holding the platform 27 at that angle.

The bottom portion of the θ-motion assembly 33 is permanently fixed to a spring-loaded fine adjustment X-motion assembly 35 that is known in the prior art. This X-motion assembly 35 includes a micrometer screw and thimble 36 for moving a top portion thereof with respect to a bottom portion thereof. This relative movement is used for making fine adjustments of the position of the substrate platform along the X-axis.

Similarly, the bottom portion of the fine adjustment X-motion assembly 35 is permanently attached to a top portion of a Y-motion assembly 37. The Y-motion assembly 37 also is a spring-loaded assembly that is known in the prior art and includes a micrometer screw and thimble 38 for making fine adjustments of the position of the substrate platform in the Y-direction. The bottom portion of the Y-motion assembly 37 is permanently fixed to the top of the traversing stage 22.

Thus, the substrate positioning assembly 12 including the traversing stage 22, the guide rails 23, the baseplate 24, the rack and pinion assembly in block 31, the θ-motion assembly 33, the fine adjustment X-motion assembly 35, and the Y-motion assembly 37, provides considerable freedom of adjustment for manipulating the position of the substrate 30 in a procedure for achieving alignment with a chip. Such procedure is further described hereinafter.

The piece part, or integrated circuit chip, handling assembly 14 includes a micromanipulator 41 having an attached chip handler 42. Such micromanipulator 41 has a control arm 43 extending down for an operator to move manually over a smooth surface 44. Relatively large movements of the control arm 43 about the surface 44 are translated by the micromanipulator 41 into relatively small proportional moves of the chip handler 42 for aligning an integrated circuit chip with the substrate 30.

Figure 2:
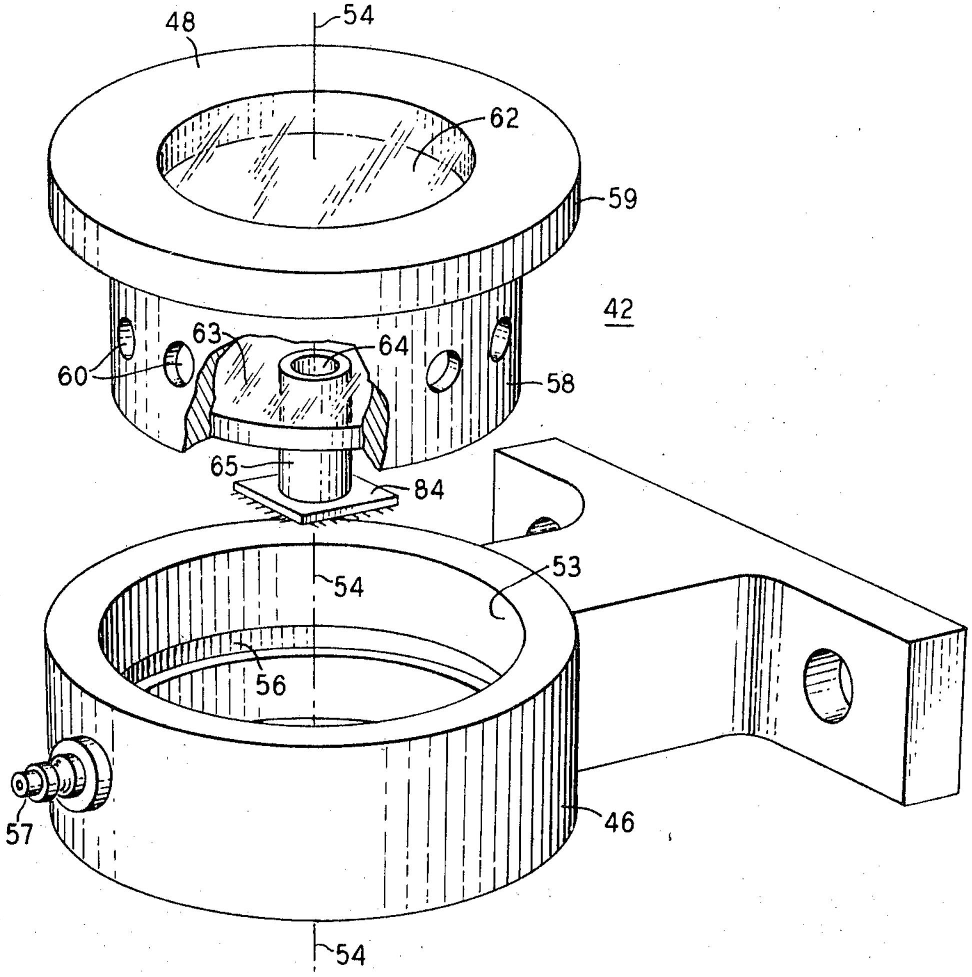
FIG. 2 is an exploded perspective view of a support and chamber arranged in accordance with the invention.

Referring now to FIG. 2, there is shown a detailed view of the chip handler 42, which includes two major parts. One such part, a mounting support cylinder 46, is permanently affixed to a Z-motion arm 47, shown in FIG. 1, extending from the micromanipulator 41. In FIG. 2 the second part is a rotatable chip-handling section 48 that fits into the mounting support cylinder 46.

As previously mentioned in reference to FIG. 1, the chip handler 42 is attached to the Z-motion arm 47 and the micromanipulator 41. Because the chip handler 42 is attached to the micromanipulator 41, the chip handler 42 moves in the X- and Y-directions in response to the control arm 43. In addition a foot pedal 51 is mechanically linked to the Z-motion arm 47 for moving the chip handler 42 in the Z-direction. A mechanical linkage 52, which includes a lever arm positioned under the table top and therefore not shown in the drawing, is arranged to reduce vertical motion of the chip handle 42 with respect to foot pedal movement. Thus the height of the chip handler 42 moves very little in response to much greater movements of the foot pedal 51.

Referring once again to FIG. 2, there is shown the inside of the support cylinder 46. Such inside includes a smoothly polished cylindrical surface 53 having a center axis 54 that is perpendicular to the surface of the substrate platform 27, shown in FIG. 1. In FIG. 2, the cylindrical surface 53 is open ended. An annular groove 56 is cut into the cylindrical surface and is connected to a vacuum inlet port 57. Although the annular groove 56 is shown as a rectangular cross section groove in FIG. 2, the cross section of the groove may be any one of several shapes.

The rotatable chip-handling section 48 is arranged to fit into the cylindrical opening of the support cylinder 46. Such chip-handling section 48 is a substantially closed chamber having the center axis 54 as its center axis. The outside of the chamber is a smoothly polished cylindrical surface 58 that fits against the inside cylindrical surface 53 of the support cylinder 46. A flange 59 extends out from the cylindrical surface 58 and fits down on top of the support cylinder 46 to hold up the chip handling section 48 and allow that section to be rotated and lifted easily.

One or more vacuum inlet openings 60 are cut through the cylindrical wall of the chip-handling section 48 so that the openings 60 are aligned with the annular groove 56 of the support cylinder 46 when the chip-handling section 48 is in place. In fact the annular groove 56 is wide enough to allow the chip-handling section 48 to move in the Z-direction without taking the opening 60 out of alignment with the groove 56.

Upper and lower ends of the chip-handling section 48 are substantially enclosed. The upper end of the chip-handling section 48 is enclosed by a thin disc of optically flat glass, or a similar disc of transparent material, 62. A thin disc of glass 62 is used to minimize refraction. The lower end of the chip-handling section 48 also is enclosed by a disc of optically flat glass 63, which has a small port 64 located at the center thereof. A hollow vacuum needle 65 is attached to the lower transparent disc 63 so that the center axis 54 is also the center axis of the port 64 and of the vacuum needle 65. The disc of glass 63 is thick enough so that the vacuum needle 65 can be securely fastened thereto.

Referring once again to FIG. 1, a line of sight exists along the center axis 54 of the chip-handling section 42 and normal to the upper surface of the substrate platform 27 when the traversing stage 22 is positioned against the right-hand stop screw 26. This line of sight includes a clear view through the upper disc 62 and through the hollow center of the vacuum needle 65 of the chip-handling section, as shown in FIG. 2. Since the line of sight is along the center axis 54 and because the center axis 54 of the chip-handling section 48 is normal to the surface of the substrate platform 27, the line of sight is normal to the surface of the substrate platform 27 in FIG. 1.

The substrate platform 27 and the chip handler 42 are parts of the vacuum system 17 used for holding the foundation part, or substrate, 30 and the piece part, or chip, in position.

In FIG. 1, a vacuum tube 71, having a cutoff valve 72 interposed therein, connects a vacuum pump 77 to a vacuum inlet 73 in the substrate platform 27. The inlet 73 is connected to a vacuum chamber inside of the platform 27. An opening in the upper surface of the platform 27 enables reduced air pressure within the chamber to exert a force on the substrate 30 to hold the substrate 30 in position on the surface of the platform 27.

A second vacuum tube 74, having a solenoid-operated valve 75 interposed therein, connects the vacuum pump 77 through a pressure regulator 76 to the vacuum inlet port 57 in the support cylinder 46, shown in FIG. 2. When air pressure in the tube 74 is reduced by the vacuum pump 77, pressure is also reduced in the hollow chamber of the rotatable chip-handling section 48 because there is an opening from the inlet port 57 through to the annular groove 56 and therethrough to the vacuum inlet openings 60 in the sidewall of the chip-handling section 48. Reduced air pressure in the chamber is transmitted through the vacuum needle 65 to exert a force for lifting and holding a chip until that chip is aligned over the substrate 30.

The vacuum system is arranged so that the vacuum in the chip-handling section 48 is sufficient to hold a chip in the air but is insufficient to prevent easy θ- and Z-motions of the chip-handling section 48 within the support cylinder 46. These θ- and Z-motions are facilitated by the smoothly polished surfaces 53 and 58 and by additional smoothly polished surfaces under the flange 59 and on the top of the support cylinder 46.

Referring once again to FIG. 1, a switch 78 affixed to the control arm 43 of the micromanipulator 41 is connected through an appropriate electrical circuit 79 to control the solenoid of the valve 75 in the vacuum tube 74.

Positioned directly above the chip handler 42 is the microscope assembly 18. A microscope 81 is mounted on a frame 82 which includes an X- and Y-direction positioner for moving the microscope during alignment. The microscope 81 has a vertical line of sight that is directed through the chip handler 42 along the center axis 54 when the microscope 81 and the chip handler 42 are positioned correctly. A vertical adjustment on the microscope 81 is used for focusing images of chips and substrates. A light 83 illuminates the surface area to be viewed by the microscope 81.

Referring once again to FIG. 2, there is shown an integrated circuit chip 84 that is held to the vacuum needle 65. The upper surface of the chip 84 and the plane of its beam leads are perpendicular to the center axis 54. Thus the center axis 54 is normal to the surface of the chip 84 and to the plane of its beam leads. Since microscope 81 has a line of sight along the center axis 54, which is normal to the plane of the beam leads, the microscope 81 can being into focus at one time all of the beam leads of the chip 84.

Vacuum needle 65 has an outside diameter which is smaller than the outside dimensions of the chip 84 so that part of the chip 84 and all of the exposed ends of the beam leads extend outside of the vacuum needle 65 on all sides. Since the beam leads extend outside of the vacuum needle 65, those leads can be viewed through the microscope 81 by way of the upper disc 62 and the lower disc 63.

Depth of field of the microscope 81 is sufficient to bring into focus at once both the beam leads and their associated conducting pads on the substrate 30 of FIG. 1.

The microscope 81 includes a removable eyepiece 86 having a reticle which is associated with the beam leads of the chip 84 and the pattern of the conducting pads on the substrate 30. The reticle can be changed by replacing either the reticle itself or by replacing the eyepiece 86 with a different eyepiece containing another reticle.

The thermocompression bonder assembly 19 is positioned over the left-hand end of the guide rails 23 of the substrate positioning assembly 12. The bonder assembly 19 includes a bonding tip 91, a nest 92 including a heating element and a thermostat, a spring-loaded piston 93, and a support housing 94. In addition a pivot rod 96, responsive to air pressure in a cylinder 97, moves the spring-loaded piston 93 down so that the bonding tip 91 presses down onto the chip 84 and substrate 30 after they are positioned under the bonding tip 91. A more detailed description of a bonder assembly, similar to the bonder assembly 19, is disclosed in U.S. Pat. No. 3,452,917, issued July 1, 1969, in the name of F. J. Schneider.

The heavy base 24 of the bonder provides a strong platform for withstanding forces developed during bonding operations. Four pads 99 are placed on the base 24 in positions where legs 100 of the traversing stage 22 set down during the bonding operation. Minimum clearance is maintained between the legs 100 and the pads 99 so that the pads support the traversing stage 22 as soon as downward pressure is applied by the bonding tip 91 to the beam leads and pads on the platform 27.

The bonder assembly is positioned so that the tip 91 is a predetermined distance away from the center axis 54. This predetermined distance is established by an operator who aligns the apparatus in preparation for bonding. The operator first selects and mounts the correct bonding tip 91 in the bonder assembly 19 and its associate reticle in the eyepiece 86. The center of the reticle lies on the center axis 54. A piece of aluminum foil is placed on a substrate on top of the substrate platform 27. The traversing stage 22 is moved to its left-hand stop screw 26 where the bonding tip 91 is lowered until it makes an impression in the foil.

Thereafter the traversing stage 22 is moved to its right-hand stop screw 26 so that the impression in the foil is more or less under the microscope 81. Then the position of the microscope 81 is adjusted until the reticle is aligned with the impression in the foil. Once this routine is completed, the reticle is positioned so that its center and the center axis 54 are a predetermined distance away from the bonding tip 91 along the X-axis. The microscope remains in this position for bonding operations that are to follow.

Then the substrate 30, which is to be bonded, is placed on the substrate platform 27 against the three guide pins and is held down by vacuum. Thereafter a chip, such as the chip 84, is lifted by the chip handler 42 and is maneuvered in the X- and Y-directions by the micromanipulator 41 and in the $\theta$-direction by the chip-handling section 48 until the beam leads are aligned with the conducting pads on the substrate.

Once the beam leads and the pads are correctly aligned, the chip handler 42 is lowered in response to movement of the foot pedal 51 until the beam leads are set down onto the conducting pads. Then the vacuum in the chip handler 42 is shut off by flipping the switch 78 on the control arm 43 of the micromanipulator 41. The chip 84 is released by the chip handler 42 and remains in its aligned position on the substrate 30.

A stop nut 88 at the top of the Z-motion arm 47 prevents the support cylinder 46 of FIG. 2 from pressing down on the substrate 30. If the stop nut 88 allows the chip-handling section 48 to drop below the level at which the beam leads of the chip 84 touch the conducting pads on the substrate 30, the chip-handling section 48 rises with respect to the support cylinder 46. Thus pressure on the chip and the substrate is maintained low enough to prevent breakage.

After the chip is released on the substrate 30, the chip handler 42 is raised above the chip. At that time the substrate platform 27 is carefully maneuvered in the X- and Y-directions so that the beams leads are positioned exactly within the reticle image. At that position the beam leads and the conducting pads are located the predetermined distance from the bonding tip 91.

Then the traversing stage 22 is moved to its left-hand stop screw 26 without jarring the chip. In this new position, the beam leads and the conducting pads are directly under the bonding tip 91. Then the operator initiates bonding so that the bonding tip 91 moves down pressing the beam leads against the conducting pads and heating the leads and the pads to complete the bonding operation, as known in the prior art. Known values of temperature and pressure are applied for a limited duration in response to power from the control console 20.

The above-detailed description is illustrative of an embodiment of the invention, and it is understood that additional embodiments thereof will be obvious to those skilled in the art. These additional embodiments are considered to be within the scope of the invention.

What is claimed is:

1. A piece part alignment apparatus comprising platform means for holding an opaque foundation piece, handling means for holding a piece part, the handling means including a line of sight therethrough normal to the surfaces of the piece part and the opaque foundation piece, and means for evacuating the handling means to hold the piece part.

2. A piece part handling apparatus in accordance with claim 1 further comprising a traversing stage including the platform for holding a foundation piece, and a microscope positioned to view through the handling means to the surfaces of the piece part and the foundation part on the line of sight normal to the surfaces of the piece part and the foundation piece.

3. A piece part handling apparatus in accordance with claim 2 wherein the handling means is a cylindrical chamber having transparent ends and is positioned so that a center axis of the cylinder is normal to the surfaces of the piece part and the foundation part, the cylindrical chamber having an annular flange about the outside of the cylinder and having at least one opening in a sidewall of the cylinder, the evacuating means having a cylinder support for encircling the handling means and supporting the flange, a vacuum pump, the cylindrical support having an annular groove connected to the vacuum pump and aligned with the opening in the sidewall of the cylindrical chamber for evacuating the chamber, and the chamber having a port in one of the transparent ends.

4. A piece part handling apparatus in accordance with claim 3 wherein the handling means is arranged to turn circumferentially within the cylindrical support, the cylindrical support is arranged to travel along a line normal to the surface of the traversing stage, the platform is arranged to travel along either of two orthogonal axes parallel to the surface of the traversing stage, and the traversing stage is arranged to travel a predetermined distance along a fixed path, and a bonder is positioned to affix the piece part to the foundation part on the traversing stage at the predetermined distance along the fixed path.

5. An integrated circuit chip alignment apparatus comprising a microscope having a line of sight, a traversing stage including a surface for holding an opaque substrate, chip-handling means for holding an integrated circuit chip and aligning beam leads thereof in registration with a pattern of conducting pads on the substrate, the chip-handling means including a cylindrical chamber having a support flange about the chamber and at least one opening in a sidewall thereof, the chamber having transparent ends and a center axis normal to the surface of the traversing stage, the line of sight of the microscope extending along the center axis of the chip-handling means to the surface of the traversing stage, a cylindrical support encircling the chip-handling means and having an annular groove around an inside wall, the groove being aligned with the opening in the sidewall of the chip-handling means, an end of the chip-handling means opposite the microscope having a port therethrough, and the cylindrical support including means for evacuating the chamber through the groove, whereby pressure is reduced in the port for holding the integrated circuit chip.

* * * * *